United States Patent [19]

Kase

[11] Patent Number: 5,247,247
[45] Date of Patent: Sep. 21, 1993

[54] LOW TEMPERATURE IC HANDLING APPARATUS

[75] Inventor: Seiichi Kase, Tokyo, Japan

[73] Assignee: NEC Corporation, Japan

[21] Appl. No.: 823,170

[22] Filed: Jan. 21, 1992

[30] Foreign Application Priority Data

Jan. 22, 1991 [JP] Japan ................................. 3-005475

[51] Int. Cl.⁵ ...................... G01R 31/02; G01R 31/28
[52] U.S. Cl. ............................... 324/158 F; 209/573; 324/73.1
[58] Field of Search ............... 324/158 F, 158 P, 72.5, 324/73.1; 209/573

[56] References Cited

U.S. PATENT DOCUMENTS

| | | | |
|---|---|---|---|
| 3,710,251 | 1/1973 | Hagge et al. ..................... | 324/158 F |
| 4,870,355 | 9/1989 | Kufis et al. ...................... | 324/158 P |
| 4,926,118 | 5/1990 | O'Connor et al. ............... | 324/158 F |

*Primary Examiner*—Ernest F. Karlsen
*Attorney, Agent, or Firm*—Laff, Whitesel, Conte & Saret

[57] ABSTRACT

A low temperature IC handling apparatus having premeasurement and postmeasurement drying chambers 3 and 4 which are provided at entrance and/or exit of a low temperature IC test chamber 1 and connected therewith via shutters 6 and 7, respectively. The drying chambers 3 and 4 are provided with low humidity nitrogen gas supply units 9 and 11, respectively, and a mechanism 13 for supplying an IC 17b to be measured to the low temperature IC test chamber 1 and a mechanism 14 for unloading a measured IC 17c from the low temperature IC test chamber 1, respectively. A control unit for controlling these mechanisms is provided. Frosting on the seam between the low temperature IC test chamber and the drying chambers and on movable components in these chambers can be prevented and dew condensation on ICs after completion of the measurement at fixed low temperature can be prevented. Therefore, operating efficiency can be considerably increased.

5 Claims, 3 Drawing Sheets

LOW TEMPERATURE IC HANDLING APPARATUS

BACKGROUND OF THE INVENTION

1. Field of the Invention

The present invention relates to a low temperature IC handling apparatus and in particular to a low temperature IC tester which automatically tests ICs in a low temperature.

2. Discription of the Related Art

Since a low temperature IC test chamber is contacted with external units such as a carry-in unit and a carry-out unit in a prior art tester, two shutters are arranged the low temperature test chamber for carrying-in/out. The shutters are only opened during the IC carry-in/out time. Two heaters are buried around the shutters for preventing the frost trouble. In some cases, heated dry air is supplied and blown thereto.

The structure of the prior art low temperature IC tester will be described in more detail with reference to the drawings.

Referring now to FIG. 1, there is shown a horizontal sectional view of a prior art low temperature IC tester. The inside of the low temperature IC test chamber 1 surrounded with an adiabatic layer 2 is maintained to keep a given low temperature with a vaporized nitrogen gas (low temperature nitrogen gas vaporized from liquid nitrogen) which is intermittently supplied from a vaporized nitrogen gas supply unit 10 (showing a pipe only in FIG. 1). An IC 17a is conveyed from a supply unit (not shown) and is set to an IC measurement position 16 in a low temperature IC test chamber 1 by an IC supply mechanism 12. At this time, an entrance shutter 29 of the low temperature IC test chamber 1 is opened for a given period of time so that it will not be interfered with an IC conveying mechanism 12. As a result of this, the temperature in the vicinity of the entrance shutter 29 is kept low with the low temperature atmosphere in the low temperature IC test chamber 1. To prevent the frost trouble in the vicinity, a dry air blow-off outlet 31 and a drying heater 32 are provided to heat with a drying air of high temperature (60° C. or more) and conduction heat from the heater 32. These outlet 31 and heater 32 are the same as in the side of an exit shutter 30 of the low temperature IC test chamber.

The problems of the above-mentioned prior art low temperature IC tester are as follows: Since the IC after completion of the low temperature test is lowered, dew or frost condensation occurs on the surfaces of the ICs when the ICs are brought into the atmosphere. The IC often get stick to IC handling mechanism in subsequent accommodating or unloading operation due to an increase in resistance against sliding and separation.

Furthermore, by opening and closing operations of the shutter, the outer atmosphere intermittently flows into a low temperature IC test chamber so that icing occurs in the low temperature IC test chamber and a critical catch of the ICs occurs at last.

In order to prevent the last mentioned critical problem, it is necessary to melt the ice and dry the inside of the low temperature IC test chamber by raising the temperature therein not lower than 60° C. This defrosting is a waste of time. Accordingly, there is a drawback that a long continuous low temperature operation is impossible. In consideration of a prior art low temperature IC tester, an operation which defrosts the inside of the tester at a temperature not lower than 60° C. for about 30 minutes is necessary once per about eight hours if IC test temperature is at −20° C. The IC test operation efficiency is only 75% (Max. 80%), because the temperature raising time from −20° C. to 60° C. about 60 minutes and vice versa about 30 minutes are necessary,

SUMMARY OF THE INVENTION

The object of the present invention is to prevent dew and frost condensation on ICs and in all chambers.

In a first aspect of the present invention, there is provided a low temperature IC handling apparatus for electrically measuring and sorting ICs at a low temperature, comprising: a low temperature Ic test chamber for measuring the IC characteristic and working at set low temperature; and premeasurement and postmeasurement drying chambers which are disposed on both sides of the low temperature IC test chamber and are connected with low temperature IC test chamber via shutters, respectively.

In a second aspect of the present invention, there is provided a low temperature IC tester for conducting electrical IC measurement and IC sorting at fixed low temperature, comprising a low temperature IC test chamber in which electrical IC measurement and IC sorting are conducted at fixed low temperature; premeasurement and postmeasurement drying chambers connected with the low temperature IC test chamber; a supply unit for supplying an IC to be measured to the premeasurement drying chamber; a first nitrogen gas supply unit for replacing atmosphere in the premeasurement drying chamber with nitrogen gas; a vaporized nitrogen gas supply unit for supplying low temperature nitrogen gas vaporized from liquid nitrogen to the low temperature IC test chamber; an IC supply mechanism for conveying an IC to be measured from the premeasurement drying chamber to the low temperature IC test chamber; a first shutter mechanism disposed between the supply unit for supplying the IC to be measured and the premeasurement drying chamber; a second shutter mechanism disposed between the premeasurement drying chamber and the low temperature IC test chamber; a measured IC unloading mechanism for conveying a measured IC from the low temperature IC test chamber to the postmeasurement drying chamber; a second nitrogen gas supply unit for replacing the atmosphere in the postmeasurement drying chamber with the nitrogen gas; a third shutter mechanism disposed between the low temperature IC test chamber and the postmeasurement drying chamber; an accommodation unit for accommodating an IC in the postmeasurement drying chamber; a fourth shutter mechanism disposed between the postmeasurement drying chamber and the accommodation unit; and a control unit for controlling the operation of each of said mechanisms and units.

DETAILED DESCRIPTION OF THE PREFERRED EMBODIMENT

The present invention will be described with reference to the drawings.

Figure 1:
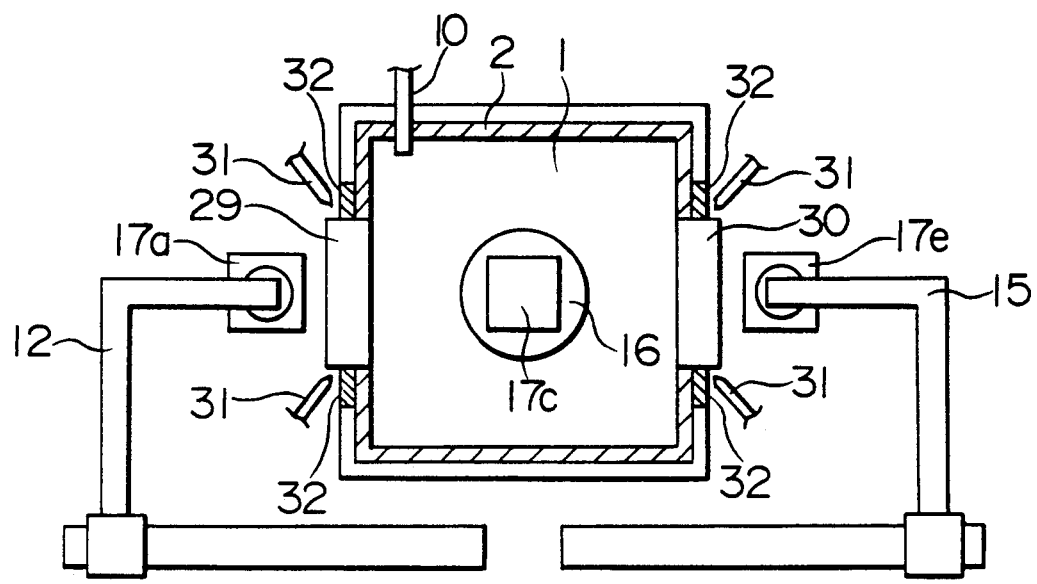
FIG. 1 is a horizontal sectional view showing a prior art low temperature IC tester.
Figure 2:
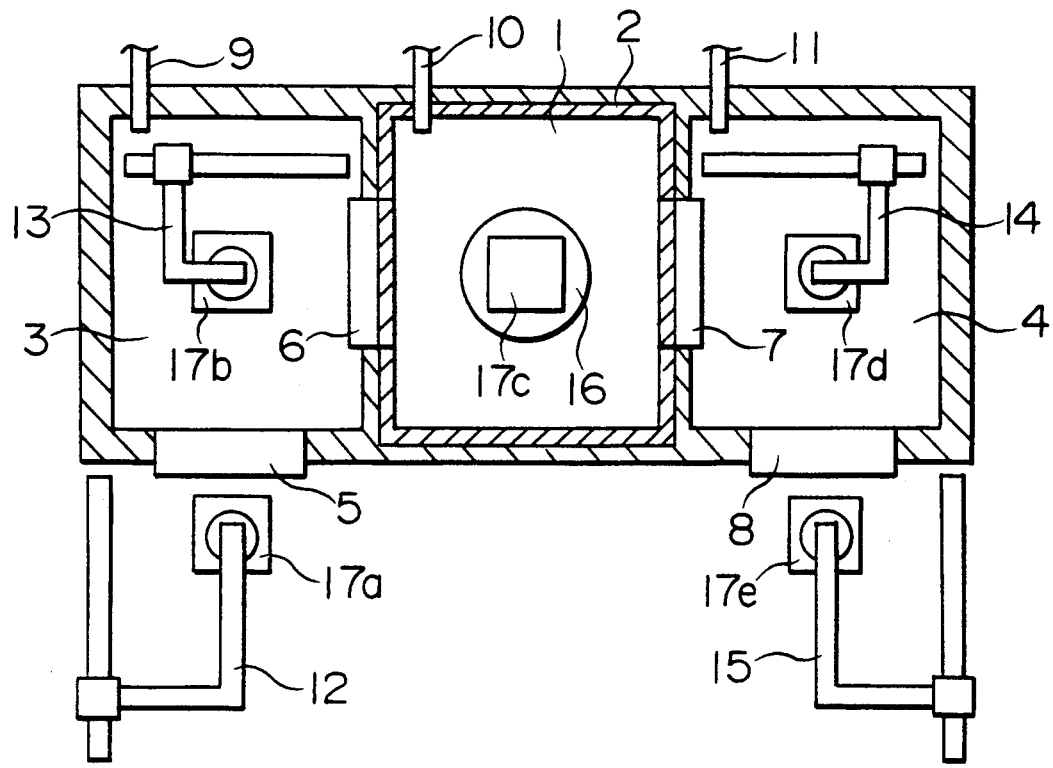
FIG. 2 is a horizontal sectional view showing a first embodiment of the present invention.

Referring now to FIG. 2, there is shown a horizontal sectional view showing a first embodiment of the present invention. Although a method of conveying ICs to be measured one by one will be described for symplifying the explanation of this embodiment, the number of the ICs which are parallel conveied is not limited herein and in the claims (The parallel conveyance is possible).

An IC 17a is loaded in a premeasurement drying chamber 3 from an IC supply unit (not shown) by means of an IC supply mechanism 12 such as a manipurator with a cacuum chuck. This mechanism 12 is next to the chamber 3 and the IC supply unit. At this loading time, a shutter 5 of the premeasurement drying chamber 3 is opened and the nitrogen atmosphere in the premeasurement drying chamber 3 is mixed with the outer atmospheric air at an room temperature (for example, 20° C.) and a room humidity (for example, 60%). Opening the shutter, nitrogen gas is then supplied from a supply unit 9 (showing the pipe only) for supplying dry nitrogen gas to the premeasurement drying chamber 3. After the mixed atmosphere in the premeasurement drying chamber 3 has been replaced with dry nitrogen gas, the shutter 5 of the premeasurement drying chamber 3 is closed so that the nitrogen atmosphere in the premeasurement drying chamber 3 becomes a condition of a room temperature and a low humidity. Since the dew point of the dry nitrogen gas is about −70° C. to −75° C., the low humidity is not higher than 0.3% which is calculated and converted from the amount of the saturated water vapor at this temperature.

On the other hand, the inside of a low temperature IC test chamber 1 which is surrounded with an adiabatic layer 2 is maintained at set low temperature (for example, −50° C.) with an vaporized nitrogen gas intermittently supplied from an vaporized nitrogen gas supply unit 10 (showing a pipe only). Under this condition, a shutter 6 between this chamber 1 and the premeasurement drying chamber 3 is opened and an IC 17b is conveyed and is set in a measurement position 16 within the low temperature IC test chamber 1 by means of an IC supply mechanism 13. The shutter opening period of time for the shutter 6 is controlled to a minimum value in order to minimize the temperature raise in the low temperature IC test chamber 1, a problem such as frosting around movable components does not occur since the humidity of the atmosphere in both chambers is as very low as about 0.3%.

Opening the shutter 7, an IC 17c which is finished the measurement is unloaded into a postmeasurement drying chamber 4 by an unloading mechanism 14 for unloading the measured IC. Then the shutter 7 is closed. This shutter 7 between this chamber 1 and the postmeasurement drying chamber 4 is opened only when the IC 17c is passing. Since the humidity in the postmeasurement drying chamber 4 is as very low as not higher than 0.3% although the temperature therein is about 20° C., frosting and dew condensation on the surface of an IC 17d does not occur. Opening the shutter 8, the IC 17d whose temperature is returned to room temperature in the postmeasurement drying chamber 4 is unloaded by an IC accommodating mechanism 15 like an IC 17e and is conveyed to a sorting and accomodation unit. Then the shutter 8 is closed. This mechanism 15 is next to the chamber 4 and the accomodation unit. A shutter 8 of the postmeasurement drying chamber 4 is opened only when the IC 17d is passing. The air-mixed nitrogen atmosphere in the postmeasurement drying chamber 4 then becomes room temperature and a higher humid condition similar to the outer atmosphere. The shutter 8 of the postmeasurement drying chamber 4 is closed after the air-mixed atmosphere has been replaced with nitrogen gas by a supply unit 11 (showing a pipe only) for supplying nitrogen gas to the postmeasurement drying chamber 4 in the same manner as in the premeasurement drying chamber 3. The shutter mechanisms in the present embodiment are opened and closed under the timing control method which can control the flow rate of the nitrogen gas in the drying chamber.

Figure 3A:
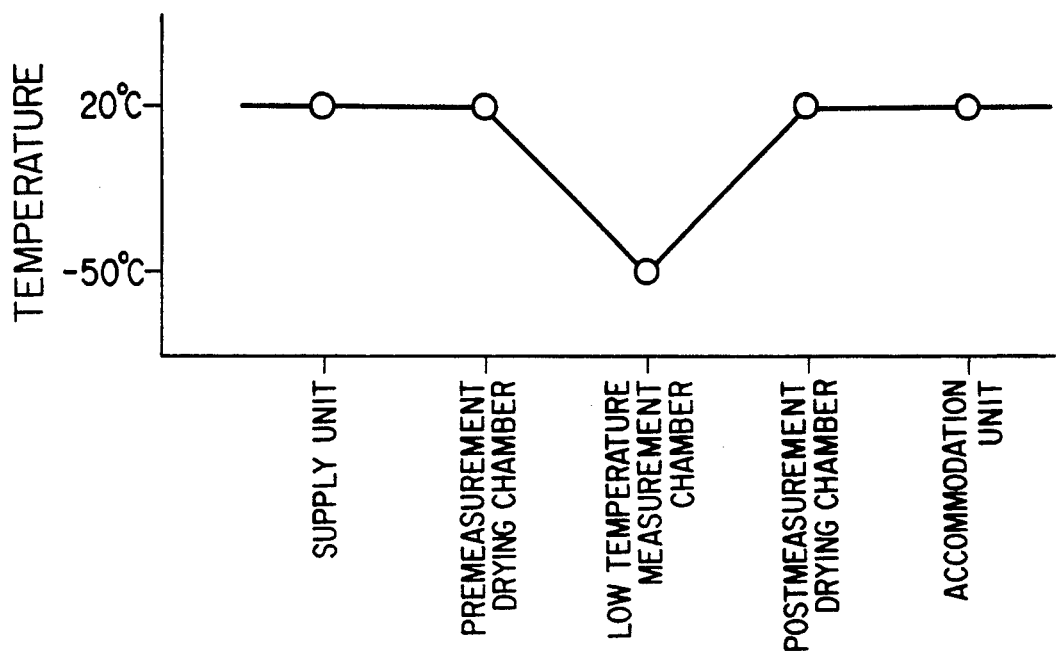
FIGS. 3a and 3b are graphs showing the relations between temperature and the humidity of each part of the first embodiment, respectively.
Figure 3B:
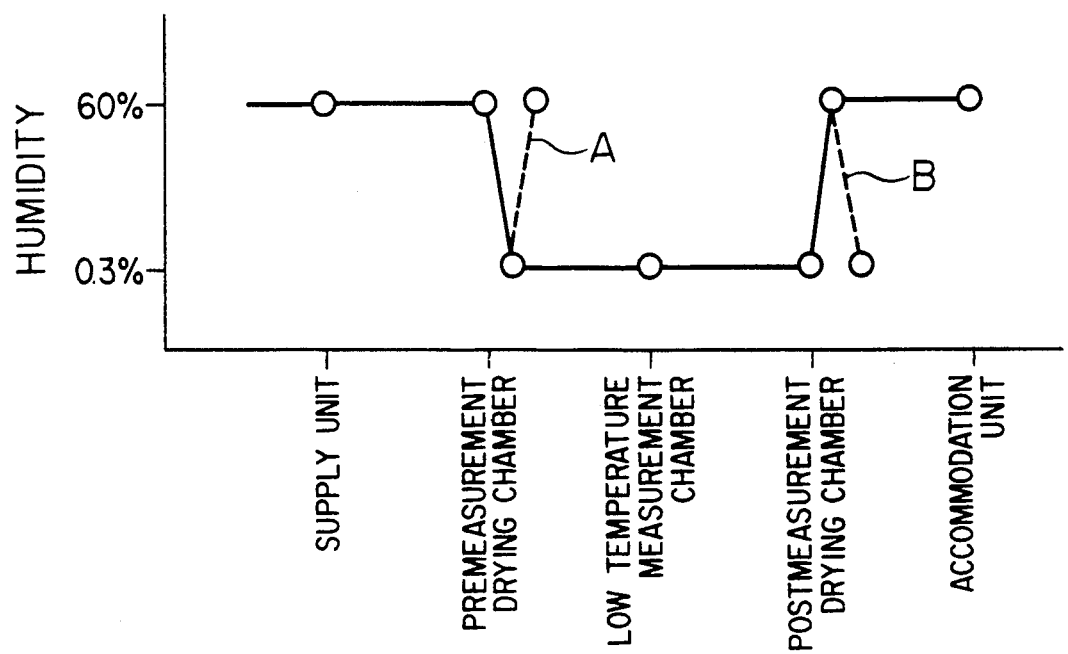

The solid lines in FIGS. 3(a) and 3(b) represent the relations between temperature and the humidity at each part in the above mentioned movement of the IC, respectively. A dotted line A in FIG. 3(b) shows that the humidity in the premeasurement drying chamber 3 increased to the same value as that of the outer atmosphere by the closing of the shutter 6 of the premeasurement drying chamber 3 and the opening of the shutter 5 of the premeasurement drying chamber 3. A dotted line B shows the similar change in humidity in the postmeasurement drying chamber 4.

Figure 4:
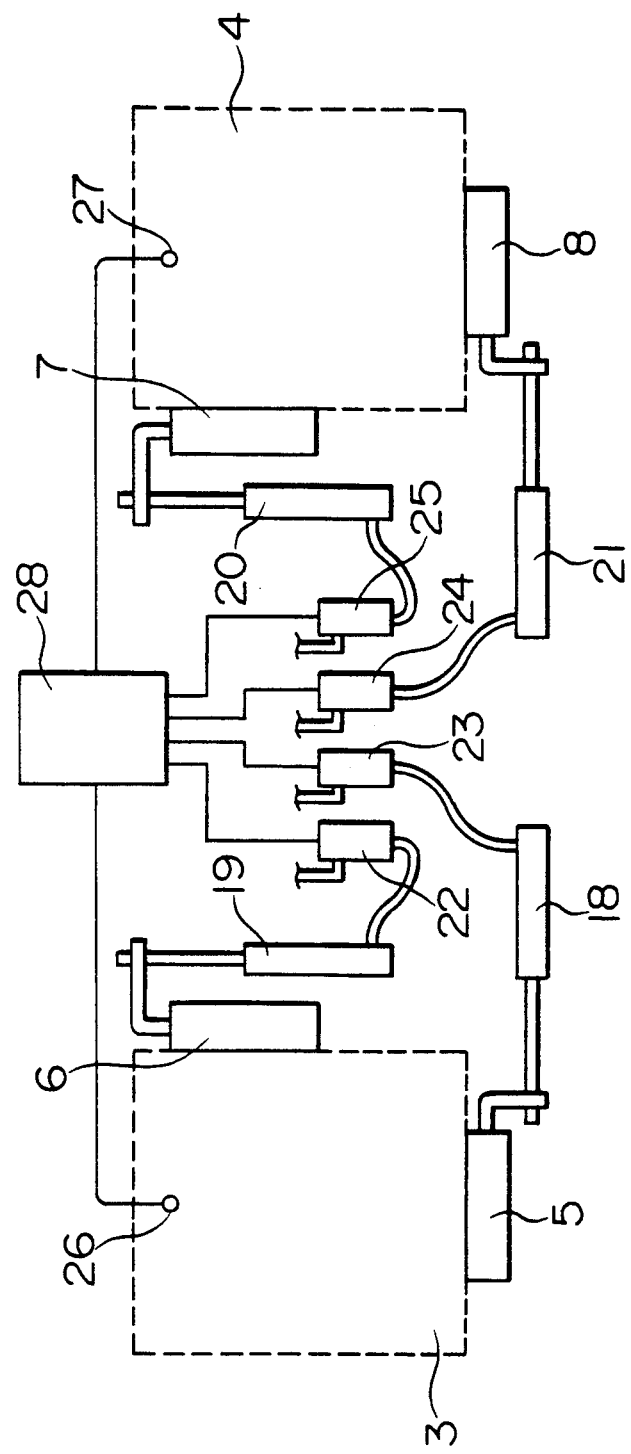
FIG. 4 is a control block diagram of a second embodiment of the present invention.

Referring now to FIG. 4, there is shown a control block diagram of a second embodiment of the present invention. Since the mechanisms of the premeasurement drying chamber 3 and the postmeasurement drying chamber 4 of the present embodiment are the same, only the movement of an IC around the premeasurement drying chamber 3 will be described. Timing of opening and closing of the shutters 5 and 6 of the premeasurement drying chamber 3 is controlled by a control unit 28 in response to a signal of a humidity sensor 26 disposed in the premeasurement drying chamber 3 instead of the control due to only timing based upon the flow rate of nitrogen gas supplied from the unit 9 for supplying nitrogen gas to the premeasurement drying chamber 3. In other words, after a driving actuator 19 such as a driving cylinder has been actuated by an electromagnetic valve 22 to close the shutter 6 of the premeasurement drying chamber 3 and the shutter 5 of the premeasurement drying chamber 3 has been opened, nitrogen gas is supplied into the drying chamber 3 so that the atmosphere in the drying chamber 3 is replaced with the supplied nitrogen gas. When a signal from a humidity sensor 26 becomes not higher than a preset value, a driving actuator 18 such as a driving cylinder is actuated by an electromagnetic valve 23 to close the shutter 5 of the premeasurement drying chamber 3 and the supply of nitrogen gas is stopped. The shutter 6 of the premeasurement drying chamber 3 is also controlled so that it will be opened when the signal from the humidity sensor 26 is not higher than a preset value.

Since opening and closing of the shutter in the second embodiment are carried out after confirming by the humidity sensor that the gas in the drying chambers becomes low humid, an increase in the humidity in the low temperature measurement chamber can be positively avoided.

As mentioned above, in accordance with the present invention, frosting on the shutters between the low temperature IC test chamber and the drying chambers and on movable components in these chambers can be prevented, and dew condensation on the IC after completion of the low temperature IC test can be prevented by controlling the humidity in the drying chambers disposed in front of and behind the low temperature IC test chamber. Accordingly, a stable measurement can be carried out at set low temperature.

Long-term continuous measurement at set low temperature can be made since no accumulation of water content to the low temperature IC test chamber occurs. The operating efficiency of the low temperature IC tester is remarkably increased.

What is claimed is:

1. An IC low temperature IC handling apparatus for electrically measuring and sorting ICs at a low temperature, comprising:

a low temperature measurement chamber for measuring the ICs at a low temperature;

a premeasurement drying chamber preceding said low temperature measurement chamber;

a postmeasurement drying chamber preceding said low temperature measurement chamber;

shutter means respectively located between said premeasurement drying chambers and said low temperature measurement chamber and between said postmeasurement drying chamber and said low temperature measurement chamber;

said measurement and post measurement drying chamber respectively connected with said low temperature measurement chamber via said shutters and said premeasurement and postmeasurement drying chamber respectively being provided with at least one supply unit for supplying low humid nitrogen gas to reduce humidity inside said premeasurement and postmeasurement drying chambers; and each shutter between said low temperature measurement chamber and each said drying chambers opening when the humidity inside the said drying chamber falls to a defined level.

2. An IC low temperature IC handling apparatus as defined in claim 1 in which said premeasurement drying chamber has a supply mechanism for supplying ICs to be measured to said low temperature measurement chamber and said postmeasurement drying chamber has a discharge mechanism for discharging the measured ICs after the measurement.

3. An IC low temperature handling apparatus as defined in claim 1 which further comprises humidity sensors which are provided in said premeasurement and postmeasurement drying chambers, respectively, and a control unit for controlling the humidity in said premeasurement and postmeasurement drying chambers in response to a signal from said humidity sensors.

4. An IC low temperature handling apparatus for conducting electrical measurement and sorting of ICs at a low temperature, comprising:

a low temperature measurement chamber in which electrical measurement and sorting of ICs is conducted at a low temperature;

premeasurement and postmeasurement drying chambers connected with the low temperature measurement chamber;

a supply unit for supplying an IC to be measured to the premeasurement drying chamber;

a first nitrogen gas supply unit for replacing atmosphere in the premeasurement drying chamber with nitrogen gas;

a vaporized nitrogen gas supply unit for supplying the low temperature measurement chamber with low temperature nitrogen gas vaporized from liquid nitrogen;

a supply mechanism for moving an IC to be measured from the premeasurement drying chamber to the low temperature measurement chamber;

a first shutter mechanism disposed between the supply unit for supplying the IC to be measured and the premeasurement drying chamber;

a second shutter mechanism disposed between the premeasurement drying chamber and the low temperature measurement chamber to open when the humidity inside the said drying chamber falls to a defined level;

a measured IC discharging mechanism for moving a measured IC from the low temperature measurement chamber to the postmeasurement drying chamber;

a second nitrogen gas supply unit for replacing the atmosphere in the postmeasurement drying chamber with nitrogen gas;

a third shutter mechanism disposed between the low temperature measurement chamber and the postmeasurement drying chamber to open when the humidity inside said drying chamber falls to a defined level;

an accommodation unit for accommodating an IC in the postmeasurement drying chamber;

a fourth shutter mechanism disposed between the postmeasurement drying chamber and the accommodation unit; and a control unit for controlling the operation of each of said mechanisms and units.

5. An IC low temperature handling apparatus as defined in claim 4 which further comprises humidity sensors which are provided in said premeasurement and postmeasurement drying chambers, respectively, and a control unit for controlling the humidity in said premeasurement and postmeasurement drying chambers in response to a signal from said humidity sensors.

* * * * *